US00RE49560E

(19) United States
(12) Reissued Patent
Cirillo et al.

(10) Patent Number: US RE49,560 E
(45) Date of Reissued Patent: Jun. 27, 2023

(54) METHOD AND A MEASURING DEVICE FOR MEASURING BROADBAND MEASUREMENT SIGNALS

(71) Applicant: Rohde & Schwarz GmbH & Co. KG, Munich (DE)

(72) Inventors: Luke Cirillo, Poing (DE); Andreas Lagler, Rosenheim (DE)

(73) Assignee: Rohde & Schwarz GmbH & Co. KG, Munich (DE)

(21) Appl. No.: 17/023,928

(22) Filed: Sep. 17, 2020

Related U.S. Patent Documents

Reissue of:
(64) Patent No.: 10,088,554
Issued: Oct. 2, 2018
Appl. No.: 14/787,268
PCT Filed: Apr. 22, 2014
PCT No.: PCT/EP2014/058069
§ 371 (c)(1),
(2) Date: Oct. 26, 2015
PCT Pub. No.: WO2014/173866
PCT Pub. Date: Oct. 30, 2014

U.S. Applications:
(63) Continuation of application No. PCT/EP2014/058069, filed on Apr. 22, 2014.

(30) Foreign Application Priority Data

Apr. 24, 2013 (DE) ..... 102013207464.6

(51) Int. Cl.
*G01S 7/40* (2006.01)
*G01R 23/20* (2006.01)
(Continued)

(52) U.S. Cl.
CPC ..... *G01S 7/4008* (2013.01); *G01R 23/20* (2013.01); *G01S 13/0209* (2013.01);
(Continued)

(58) Field of Classification Search
CPC ... G01R 23/20; G01S 7/4008; G01S 13/0209; G01S 13/343; G01S 7/406; G01S 7/358
See application file for complete search history.

(56) References Cited

U.S. PATENT DOCUMENTS 5,162,723 A * 11/1992 Marzalek ..... G01R 23/16 324/121 R
5,784,285 A * 7/1998 Tamaki ..... G01R 29/0892 324/76.12
(Continued)

FOREIGN PATENT DOCUMENTS

DE 112005001355 T5 5/2007
DE 102008037308 A1 6/2009
(Continued)

OTHER PUBLICATIONS

De Patent Office, "Examination Report", Application No. DE102013207464.6, dated Oct. 13, 2020.
(Continued)

*Primary Examiner* — Woo H Choi
(74) *Attorney, Agent, or Firm* — Potomac Technology Law, LLC

(57) ABSTRACT

The invention relates to a method for determining a deviation of a broadband measurement signal from a reference signal. The method provides the steps: subdivision of the signal into at least two measurement-signal frequency bands; displacement of the measurement-signal frequency bands; and reconstruction of the at least two measurement-signal frequency bands. A corresponding measurement device is also contained within the idea of the invention.

34 Claims, 9 Drawing Sheets

(51) Int. Cl.

| | |
|---|---|
| ***G01S 13/02*** | (2006.01) |
| ***G01S 13/34*** | (2006.01) |
| ***G01S 7/35*** | (2006.01) |

(52) U.S. Cl.

CPC ..... *G01S 13/343* (2013.01); *G01S 7/358* (2021.05); *G01S 7/406* (2021.05)

(56) References Cited

U.S. PATENT DOCUMENTS 6,724,836 B1 * 4/2004 Graf ..... H04L 27/144 375/279
7,317,309 B2 * 1/2008 Yamaguchi ..... G01R 23/16 324/76.19
2005/0239432 A1 * 10/2005 Wilcox ..... H04B 1/71637 455/334
2005/0273320 A1 * 12/2005 Yamaguchi ..... G01R 23/16 704/205
2007/0273863 A1 * 11/2007 Leep ..... G01R 23/16 356/5.15
2008/0292039 A1 * 11/2008 Vossiek ..... G01S 5/06 375/358
2013/0070256 A1 * 3/2013 Tokimitsu ..... G01B 9/02004 356/498

FOREIGN PATENT DOCUMENTS

WO WO2004001998 A1 12/2003
WO WO2005121815 A1 12/2005

OTHER PUBLICATIONS

PCT, "International Preliminary Report on Patentability (English Translation)", PCT/EP2014/058069, Oct. 27, 2015.
Rohling, et al., "Radar Waveform for Automotive Radar Systenms and Applications", IEEE, 1-4244-1539-X, 2008.
"International Preliminary Report on Patentability (English Translation)", PCT/EP2014/058069, dated Oct. 27, 2015.

* cited by examiner

METHOD AND A MEASURING DEVICE FOR MEASURING BROADBAND MEASUREMENT SIGNALS

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

PRIORITY

The present application *is a Reissue of U.S. patent US10088554B2* (*granted 2018 Oct. 2*), *which* is a U.S. national phase application under 35 U.S.C. § 371 of PCT application No. PCT/EP2014/058069 (filed 2014 Apr. 22), which claims priority to German Patent Application No. DE 102013207464.6 (filed 2013 Apr. 24), the entireties of which are hereby incorporated by reference herein.

BACKGROUND

The invention relates to a method for determining a deviation of a broadband measurement signal, especially a radar measurement signal, from a reference signal, and a corresponding measuring device.

The use of recurring continuous-waveform signals, referred to in the following as measurement signals, is established in radar technology. The term continuous-waveform signal (CW), covers electromagnetic waves of constant amplitude and frequency. In modern automotive radar technology, frequency-modulated continuous waveforms are used, for example, to realize distance-control systems, distance-warning systems or parking aids in automobiles.

With these radar systems, a continuous waveform is transmitted and a possible reflection of the signal from objects in the environment of the radar system is received. Such signals are linear-frequency-modulated, wherein the linearity of the frequency modulation provides different gradients. From the comparison between the received measurement signal and a transmitted reference signal, inferences can be drawn regarding the distance and relative velocity between the transmitter and an object. In particular, the time delay and the offset (Doppler) between the transmitted reference signal and the received measurement signal are evaluated in this context.

The publication "Radar Waveform for Automotive Radar Systems and Applications" by the authors Rohling and Möller, published at the IEEE Radar Conference in May 2008, describes an automotive radar system in which velocity-resolving signals and distance-resolving signals are investigated. In this context, linear-frequency-modulated continuous waveforms are used. These signals are at least partially linear.

The greater the bandwidth of the measurement signal, the greater the depth resolution of the radar system. For radar systems, which operate in a frequency band from 77 GHz to 81 GHz, the bandwidth of such a measurement signal is typically 2 GHz.

In order to evaluate the accuracy of a radar system, a deviation of the linearity of the measurement signal from the linearity of a reference signal is determined. Alternatively, the phase response of such a signal is investigated. A deviation of the measurement signal from an ideal characteristic, referred to below as the reference signal, has a negative effect on the accuracy of the radar system and accordingly reduces the performance of the system. The deviations of the measurement signal from the reference signal caused by the linearity error are within the range of a few KHz. Such a broadband measurement signal cannot be evaluated with regard to this error expectation using currently available signal analyzers.

What is needed, therefore, is a method and a measuring device for determining a deviation of a broadband measurement signal from a reference signal in which the analysis bandwidth of a measuring device is substantially smaller than the bandwidth of the measurement signal.

Some Example Embodiments

Embodiments of the present invention advantageously address the foregoing requirements and needs, as well as others, by providing a method and a measuring device for determining a deviation of a broadband measurement signal from a reference signal in which the analysis bandwidth of a measuring device is substantially smaller than the bandwidth of the measurement signal.

In accordance with example embodiments of the present invention, a method is provided with the method steps: subdivision of the broadband measurement signal into at least two measurement-signal frequency bands; displacement of the at least two measurement-signal frequency bands to correspond with the reference-signal frequency bands of the reference signal corresponding to the measurement-signal frequency bands; and reconstruction of the at least two measurement signal bands to form a reconstructed broadband measurement signal.

In the following, a signal of which the bandwidth is greater than the analysis bandwidth of a measurement signal by a large multiple is understood as a broadband signal. The bandwidth of every frequency band is preferably smaller than the analysis bandwidth of the measuring device.

According to such embodiments a broadband measurement signal is split into at least two frequency bands, and an analysis of the measurement signal corresponding to the individual frequency bands is implemented. On the basis of appropriate signal-processing algorithms, each frequency band is then displaced corresponding to a reference signal, so that a broadband, reconstructed measurement signal can be obtained. This reconstructed signal can then be displayed on a display device for evaluation.

By way of example, the broadband measurement signal is a periodic frequency-modulated signal, wherein a period of the signal is at least partially linear-frequency-modulated. As a result of the periodicity, the measurement signal can be used as a radar measurement signal, for example, in order to be available for distance controls, distance warnings or parking aids in an automobile.

According to one embodiment, a partially linear measurement signal, which is also designated as a segmentation of the measurement signal is realized, for example, through a first linear gradient of the frequency over a first time period and through a second linear gradient of the frequency over a second time period. These linear gradients can also provide different signs. If a second gradient different from a first gradient is accommodated within a period of the measurement signal, distance information and velocity information regarding a detected object in the environment of the radar system can be registered very accurately through the time delay and offset of the measurement signal relative to the reference signal.

According to a further embodiment, after the step of reconstruction, a step of subtracting the reference signal from the reconstructed broadband measurement signal is implemented. The deviation of the measurement signal from the reference signal is obtained directly as a result. Typically, the deviation is a few KHz, so that the subdivision of the measurement signal into more than two measurement-signal frequency bands must be implemented in order to obtain a sufficiently high resolution of the measurement signal by means of the signal analyzer. Alternatively, after the step of reconstruction, a step of displaying the reconstructed broadband measurement signal with the reference signal is implemented. In this manner, the deviation can be evaluated visually.

According to a further embodiment, the step of displacement also comprises the step of correlating every measurement-signal frequency band with the reference signal. In this manner, the corresponding frequency bands of the measurement signal can be combined with regard to their time delay and the carrier frequency of the respective frequency band. As a result of the correlation according to the invention, the individual frequency bands are therefore correctly reconstructed. The step of displacement thus takes place both in the time domain and also in the frequency domain.

By way of example, the step of displacement is implemented with the use of an external trigger signal. As a result, the analysis period for registration of the measurement signal can be selected to be substantially shorter, since, it is determined on the basis of the information of the carrier signal, when a period of the measurement signal begins. A time displacement of the respective frequency band for the reconstruction of the measurement signal is therefore achieved in a relatively simple manner.

According to a further embodiment, the step of reconstruction comprises the addition of all displaced measurement-signal frequency bands. The broadband measurement signal obtained in this manner is compared with a reference signal.

By way of example, the step of displacement takes place within the frequency-modulation (FM) domain. This allows the offset of the measurement signal from the reference signal and the frequency displacement of the individual sub-frequency bands for the reconstruction of the measurement signal to be implemented on the basis of a simple addition.

According to a further embodiment, a demodulation step is implemented before the step of displacement. Since signal analyzers generally provide the frequency sub-bands the baseband in the in-phase and quadrature phase domain (I/Q domain), the conversion of the frequency sub-bands into the FM domain is achieved through a frequency demodulation, which, as mentioned, leads to the relatively simple reconstruction of the measurement signal.

By way of further example, the step of displacement is also implemented in the I/Q domain. The step of reconstruction is then achieved through time displacement of every measurement-signal frequency band by a time offset corresponding to the reference signal, multiplication of every time-displaced frequency band by a frequency-band carrier frequency, addition of all multiplied measurement-signal frequency bands to form a reconstructed broadband measurement signal and demodulation of the reconstructed measurement signal.

According to a further embodiment, a step of measurement-error correction is implemented before the step of subtraction, for example, through a reduction of the video noise and/or a bandwidth limitation of the reconstructed measurement signal. This substantially reduces the background noise.

In accordance with further example embodiments of the present invention, a measuring device for the analysis of a broadband measurement signal is provided. The measuring device comprises a unit for subdivision the broadband measurement signal into at least two measurement-signal frequency bands, wherein each measurement-signal frequency band is an I/Q baseband signal. The measuring device further comprises a unit for the displacement of the individual measurement-signal frequency bands with reference to the corresponding reference-signal frequency bands of a reference signal. The measuring device further comprises a unit for reconstruction the aligned measurement-signal frequency bands to form a reconstructed broadband measurement signal. The measuring device also comprises a unit for the analysis of the reconstructed broadband measurement signal relative to the reference signal, wherein a deviation of the reconstructed broadband measurement signal relative to the reference signal is provided as a start value of the measuring device.

By way of example, the measuring device provides a unit for the reduction of background noise. This unit is either a video filter and/or a unit for averaging the reconstructed measurement signal. This averaging is also designated as a trace averaging.

BRIEF DESCRIPTION OF THE DRAWINGS

These and other features, aspects and advantages of the present invention are explained in greater detail with reference to the Figures of the drawings, wherein the Figures illustrate exemplary embodiments of the invention. Identical components in the Figures are provided with identical reference numbers. Accordingly, embodiments of the present invention are illustrated by way of example, and not by way of limitation, in the figures of the accompanying, in which:

FIG. 4b shows a transmission characteristic of the subdivision unit illustrated in FIG. 4a;

DETAILED DESCRIPTION

Figure 1:
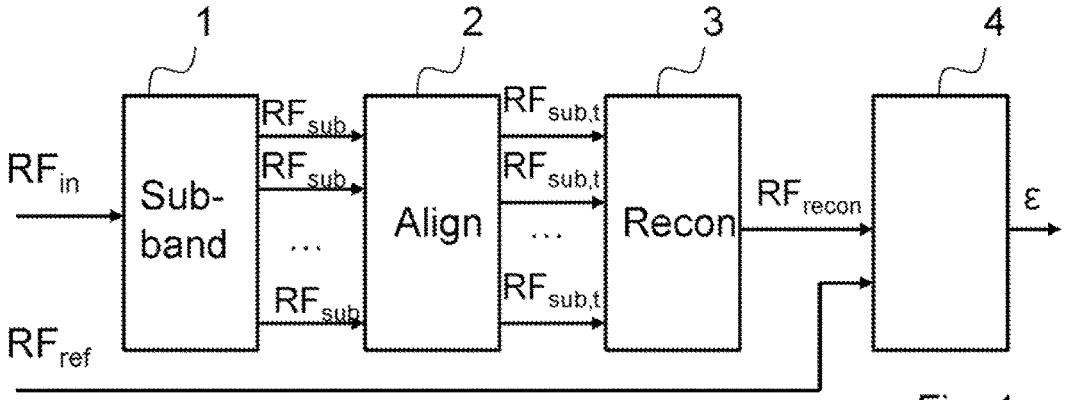
FIG. 1 shows a block diagram of an approach for the averaging of a measurement-signal deviation, in accordance with example embodiments of the invention.

FIG. 1 shows a block diagram of an approach for the averaging of a measurement-signal deviation, in accordance with example embodiments of the invention. In this context, a broadband measurement signal $RF_{in}$ is connected to an input of a subdivision unit 1. Several frequency bands $RF_{sub}$ of the measurement signal $RF_{in}$ are supplied to the output of the subdivision unit 1. These measurement-signal frequency bands $RF_{sub}$ are supplied to an alignment unit 2. Displaced measurement-signal frequency bands $RF^{sub,t}$ are provided at the output of the alignment unit 2. These measurement-signal frequency bands $RF_{sub,t}$ are supplied to a reconstruction unit 3. A broadband reconstructed measurement signal $RF_{recon}$ is provided at the output of the reconstruction unit 3. The broadband combined measurement signal $RF_{recon}$ is supplied to an evaluation unit 4. A deviation signal ε between the measurement signal $RF_{in}$ and the reference signal $RF_{ref}$ is provided at the output of the evaluation unit 4. The reference signal $RF_{ref}$ required for this purpose is made available to the evaluation unit 4 or generated there.

With further reference to FIG. 1, a broadband measurement signal is split into a plurality of frequency sub-bands $RF_{sub}$. As a result of the subdivision, a measuring device, especially a signal analyzer, with a relatively smaller resolution bandwidth than the bandwidth of the measurement signal $RF_{in}$ can be used to determine the deviation ε between the measurement signal $RF_{in}$ and the reference signal $RF_{ref}$. With regard to radar measurement signals, the deviation error ε occurs within the KHz range, while the bandwidth of the measurement signal $RF_{in}$ amounts to several GHz. *According to a further embodiment, the measuring device provides a unit for determining the number of measurement-signal frequency bands ($RF_{sub}$) depending on the bandwidth (B) of the received measurement signal ($RF_{in}$), and the unit increases the number of measurement-signal frequency bands with increasing bandwidth.*

Figure 2:
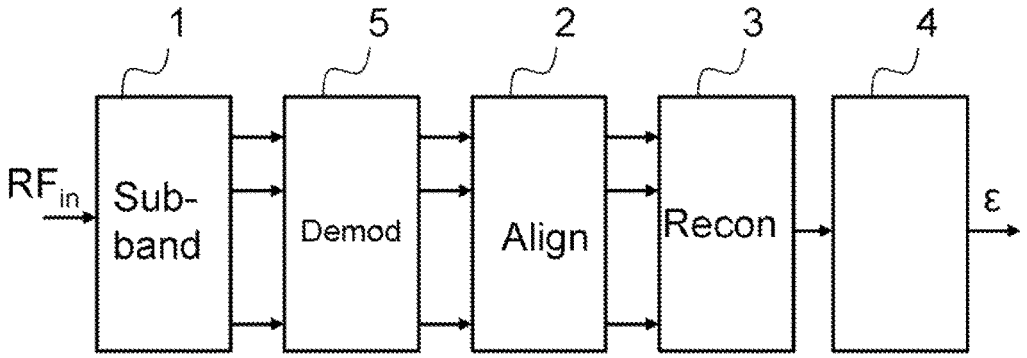
FIG. 2 shows a block diagram of a further approach for the averaging of a measurement-signal deviation, in accordance with example embodiments of the invention.
Figure 5:
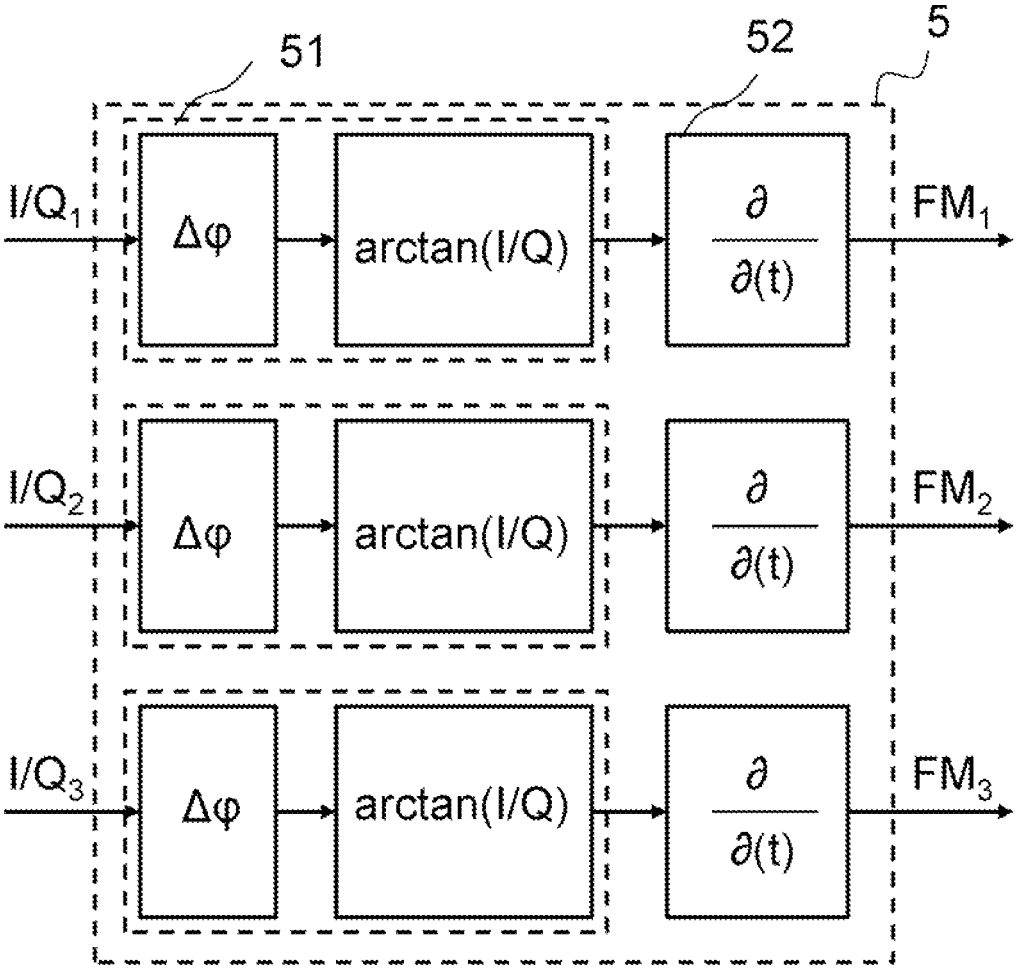
FIG. 5 shows a block diagram of a frequency demodulator according to an example embodiment of the invention.

FIG. 2 shows a block diagram of a further approach for the averaging of a measurement-signal deviation, in accordance with example embodiments of the invention. The illustration according to FIG. 2 shows a method or respectively a measuring device according to the invention which operates in an I/Q domain. Such In-Phase/Quadrature phase signals are used in a standardized manner in measuring devices. In order to obtain a transformation from the I/Q domain into a frequency domain, a demodulator 5, which is presented in greater detail in FIG. 5, is introduced, as shown in FIG. 2, between the subdivision unit 1 and the alignment unit 2. Following this, the alignment unit 2 and the reconstruction unit 3 can determine the reconstructed measurement signal $RF_{recon}$ with simple mathematical operations, especially addition, in order to provide the alignment error ε.

Figure 3:
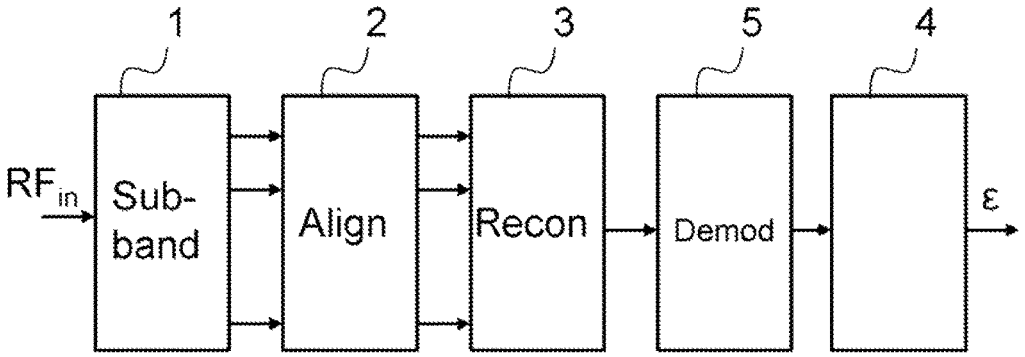
FIG. 3 shows a block diagram of an alternative approach to that shown in FIG. 2.

As an alternative to FIG. 2, FIG. 3 shows a block diagram of an alternative approach to that shown in FIG. 2. By way of difference from FIG. 2, the demodulation unit 5 is introduced between the reconstruction unit 3 and the evaluation unit 4. As shown in the exemplary embodiment of FIG. 3, the subdivision unit 1 provides the measurement signal $RF_{in}$ in the measurement-signal frequency bands $RF_{sub}$ in the I/Q domain. According to FIG. 3, the I/Q data provided in this manner are made directly available to the alignment unit 2 and the reconstruction unit 3.

Accordingly, FIGS. 1 to 3 show exemplary embodiments for the subdivision of a broadband measurement signal $RF_{in}$. For this purpose, a combined, broadband measurement signal $RF_{recon}$, which is compared with a reference signal $RF_{ref}$, is supplied, on the one hand, to the evaluation unit 4. The comparison can be determined by subtracting the reference signal $RF_{ref}$ from the combined broadband measurement signal $RF_{recon}$, wherein the deviation error ε is then displayed directly. As an alternative, the evaluation unit 4 is a display element of a measuring device which merely displays the signals $RF_{recon}$ and $RF_{ref}$. The deviation ε can then be inferred by means of appropriate evaluation algorithms.

Figure 4A:
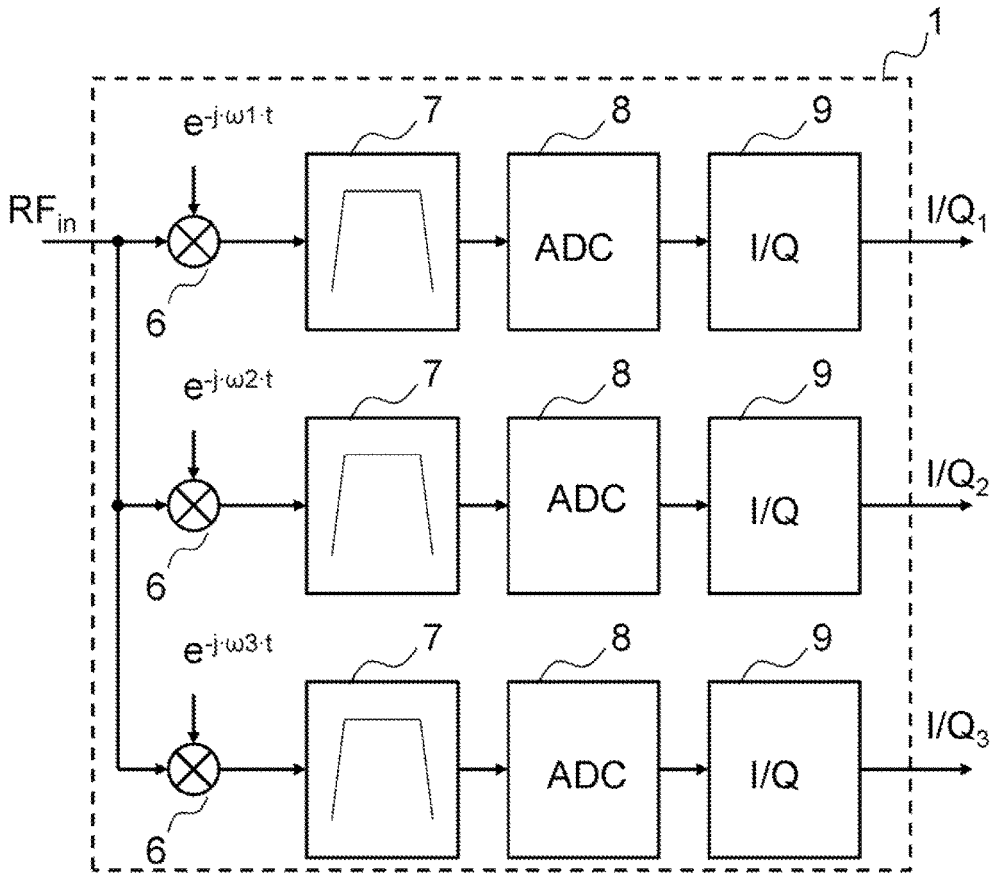
FIG. 4a shows a block diagram of a subdivision unit according to an example embodiment of the invention.

FIG. 4a shows a block diagram of a subdivision unit 1 according to an example embodiment of the invention. The measurement signal $RF_{in}$ connected at the input of the subdivision unit 1 is subdivided into three frequency bands $I/Q_1$, $I/Q_2$ and $I/Q_3$. In this context, the bandwidth of each frequency sub-band $I/Q_1$, $I/Q_2$ and $I/Q_3$ is smaller than the analysis bandwidth of the measuring device.

According to FIG. 4a, the $RF_{in}$ is mixed in a mixing unit 6 with a first carrier frequency $\omega_1$. Following this, the part of the spectrum of the measurement signal $RF_{in}$ which is not to be a part of the frequency sub-band $I/Q_1$ is removed via a filter element 7, especially a band-pass filter. Following this, the baseband signal obtained is digitized in an analog/digital converter 8 and supplied to an I/Q modulator 9. At the output of the I/Q modulator 9, a frequency sub-band $I/Q_1$ is obtained. The respective frequency sub-band is then present as so-called I/Q data and is designated in the following as an $I/Q_1$ signal.

The two other frequency bands $I/Q_2$, and $I/Q_3$ are mixed respectively by mixing the input signal $RF_{in}$ with a second carrier frequency $\omega_2$ or a third carrier frequency $\omega_3$. Accordingly, frequency sub-bands are obtained at the output as I/Q data.

Figure 4B:
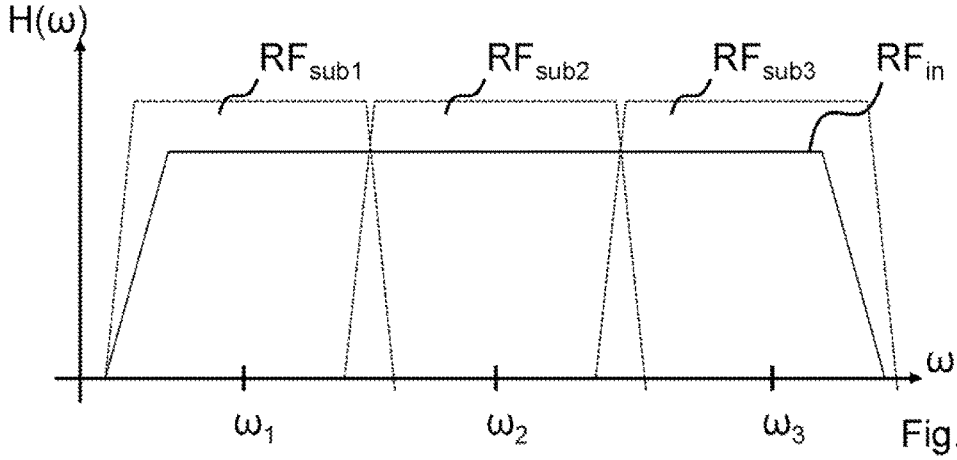

FIG. 4b shows a transmission characteristic of the subdivision unit 1 shown in FIG. 4a. In this context, the broadband signal $RF_{in}$ is drawn as a continuous line. The signal $RF_{in}$ is subdivided into three sub-bands $RF_{sub1}$ to $RF_{sub3}$ corresponding to the carrier frequencies ω1, ω2, ω3, which are each illustrated as dashed lines. These sub-bands $RF_{sub}$ are further processed by the mixer units 6 as baseband signals. The filtering necessary for this purpose is implemented by the filter element 7.

The selection of the number of frequency bands takes place within the measuring device itself. In this context, the resolution bandwidth of the measuring device and the bandwidth B of the measurement signal are critical. The broader the bandwidth of the measurement signal $RF_{in}$, the more frequency bands are necessary in order to perform a signal analysis with a suitable resolution, especially in the KHz range.

FIG. 5 shows a block diagram of a demodulation unit 5 according to an example embodiment of the invention. With further reference to FIG. 2 and FIG. 3, this provides for the conversion of frequency bands which are present as an I/Q signal, as shown, for example, in FIG. 4a, into frequency bands in the FM domain. In general, for a phase-invariant signal x(t) with amplitude A $$x(t)=A\cdot e^{j\varphi(t)}$$

The angular frequency ω is the time derivation of the phase φ:

$$\omega(t) = \frac{\partial}{\partial t}\varphi(t)$$

For a time-discrete signal, the following applies:

$$x[n]\cdot x^*[n-1]\rightarrow|\lambda^2|e^{j[\varphi[n]-\varphi[-1]]}$$

In the case of time-discrete signals, the following applies for the phase φ:

$$\varphi = \arctan\left(\frac{Q}{I}\right)$$

wherein I denotes the in-phase component and Q denotes the quadrature-phase component of the respective I/Q signal.

Accordingly, in the case of the supplied signals $I/Q_1$ to $I/Q_3$, the phase of value φ is determined from phase differences Δφ and arctan calculation between two successive sampled values of the I/Q signal in the phase unit 51. The result from the phase unit 51 is then supplied to the differentiator 52, which determines the derivation of the phase according to the above relationship. Accordingly, through the derivation of the phase information of the respective I/Q signal, a signal is transferred into the frequency domain. A differentiator 52 is produced especially by means of an ideal high-pass or by means of a high-pass which is linear at least for the sub-range necessary for the frequency domain of the sub-band $RF_{sub}$.

Figure 6:
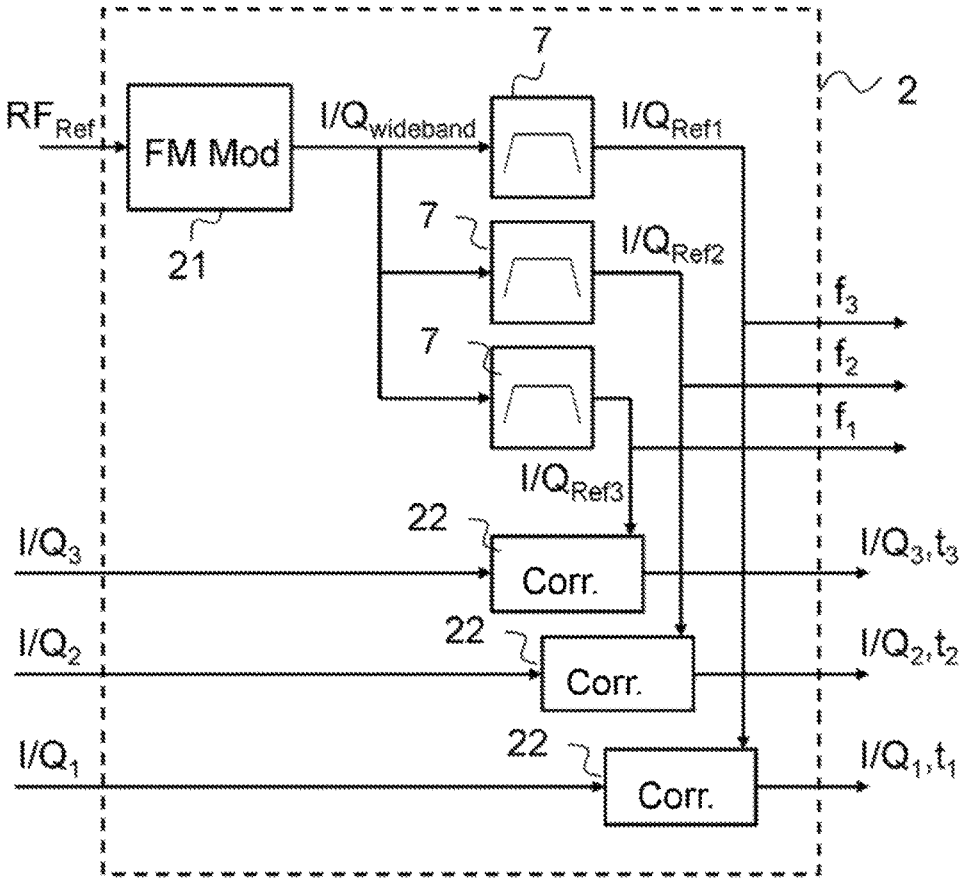
FIG. 6 shows a block diagram of an alignment unit in the I/Q baseband according to an example embodiment of the invention.

FIG. 6 shows a block diagram of an alignment unit 2 according to an example embodiment of the invention. According to FIG. 6, I/Q signals according to the exemplary embodiment from FIG. 3 are connected to the input of the alignment unit 2. By means of a correlator 22, the corresponding I/Q signal is correlated with a reference frequency band $I/Q_{ref}$ corresponding to the respective frequency band. In order to obtain such a reference frequency band $I/Q_{ref}$, the reference signal $RF_{ref}$ is modulated by means of a frequency modulator 21 and bandwidth limited by means of filter elements 7.

Through the correlators 22, the corresponding reference bands $I/Q_{ref}$ are compared with the respective I/Q signals in order to determine the corresponding time constant t and the corresponding carrier frequency f. The time constant t and the carrier frequency f are necessary in order to combine the I/Q signals (baseband signals) in the correct sequence and with the correct time succession in the reconstruction unit 3 to form the reconstructed signal $RF_{recon}$.

The respective time displacements $t_1$ to $t_3$ and also the carrier frequencies $f_1$ to $f_3$ can be picked up at the output of the alignment unit 2. The carrier frequencies $f_1$ to $f_3$ correspond to the carrier frequencies $\omega_1$, $\omega_2$ and $\omega_3$ of the subdivision unit 1.

Figure 7:
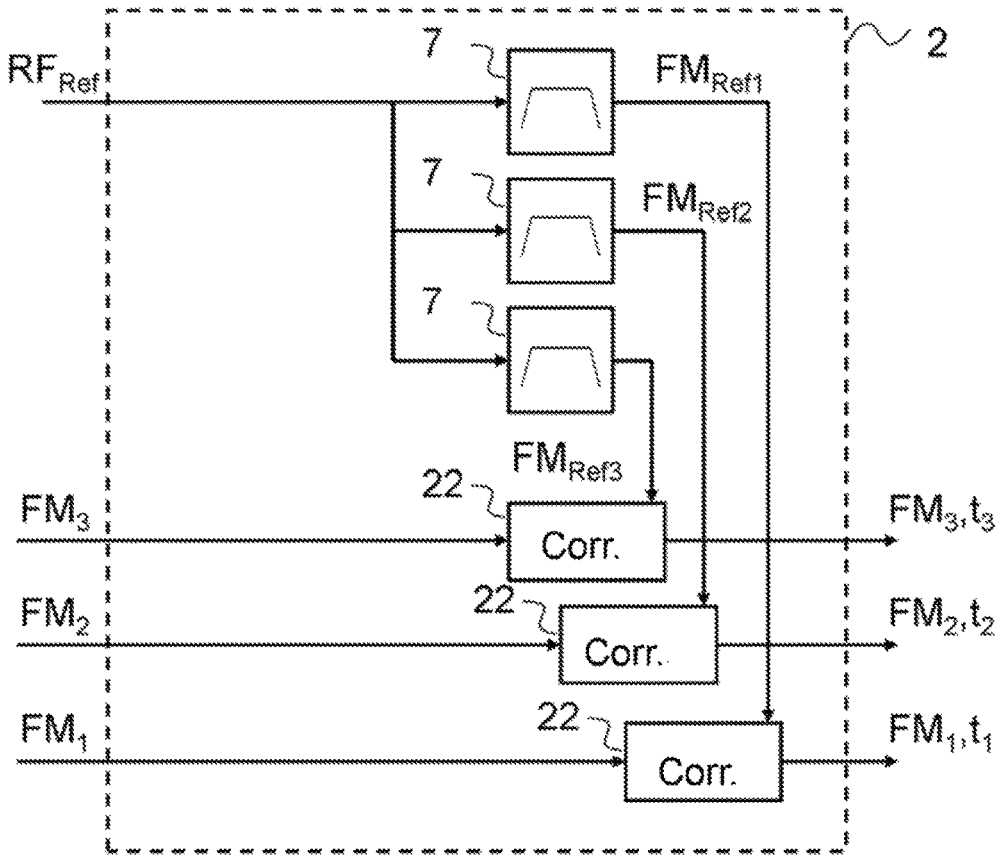
FIG. 7 shows a block diagram of an alignment unit in the FM baseband according to an example embodiment of the invention.

FIG. 7 shows a block diagram of [a reconstruction unit 3] *an alignment unit 2* (e.g., for the exemplary embodiment shown in FIG. 2) according to an example embodiment of the invention. In this context, each of the frequency sub-band $FM_1$ to $FM_3$ are correlated with a reference signal sub-band $FM_{ref1}$ to $FM_{ref3}$ corresponding to the frequency sub-band $FM_1$ to $FM_3$. At the output of the alignment unit 2, corresponding to FIG. 6, the parameters $t_1$ to $t_3$ and the frequencies $f_1$ to $f_3$ are supplied as parameters to the reconstruction unit. The carrier frequencies $f_1$ to $f_3$ correspond to the carrier angular frequencies $\omega_1$, $\omega_2$, and $\omega_3$ of the subdivision unit 1.

It is evident that the reconstruction unit 2 according to FIG. 7 can be realized more simply than the reconstruction unit 2 according to FIG. 6, since a modulation of the reference signal $RF_{ref}$ need not be implemented in the I/Q domain, which leads to a simplification if the reference signal $RF_{ref}$ is present in the FM domain.

Figure 8:
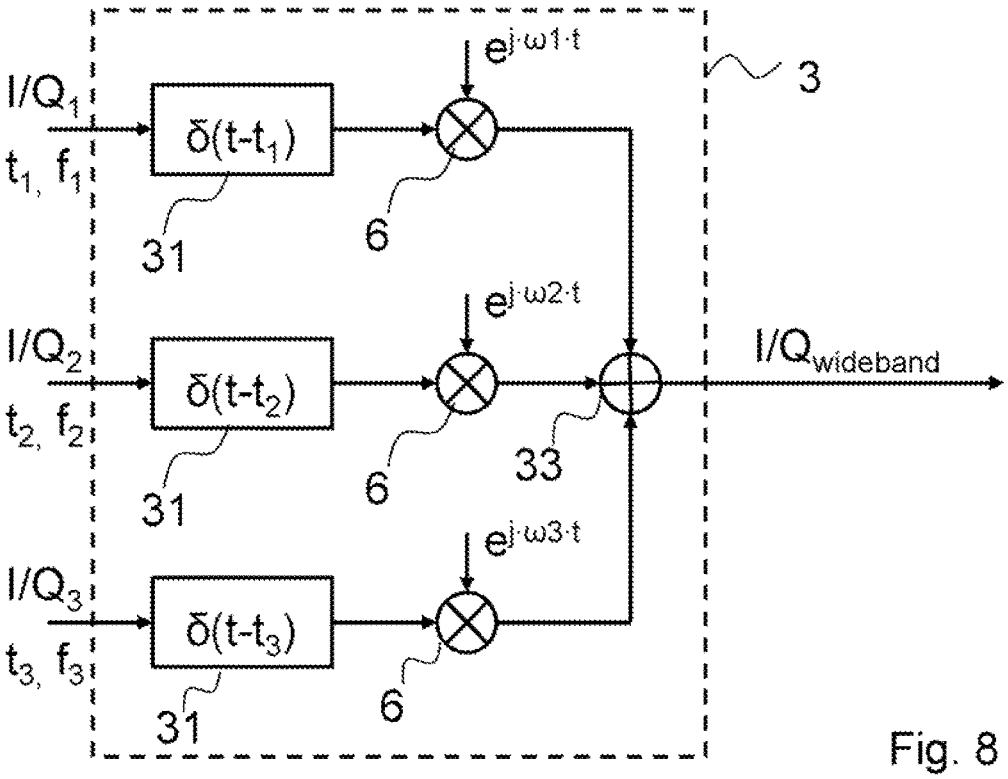
FIG. 8 shows a block diagram of a reconstruction unit in the I/Q domain according to an example embodiment of the invention.

FIG. 8 shows a block diagram of a reconstruction unit 3 according to an example embodiment of the invention. In this context, I/Q signals according to the exemplary embodiment from FIG. 3 are connected to the input of the reconstruction unit 3. Additionally, the time delays t and carrier frequencies f determined according to the alignment unit 2 are supplied to the reconstruction unit 3 for each I/Q signal.

In this context, each I/Q signal $I/Q_1$ to $I/Q_3$ is supplied to a time delay unit 31 in order to reconstruct a determined time delay of the measurement signal $RF_{in}$ in a time-corrected manner. After the time displacement of the respective signal $I/Q_1$ to $I/Q_3$ by means of a mixer unit 6, the respective I/Q signal is displaced into the corresponding frequency domain of the measurement signal $RF_{in}$. Finally, all of the displaced signals are combined by means of an adding unit 33. At the output of the reconstruction unit 3, a broadband reconstructed I/Q signal is generated.

Figure 9:
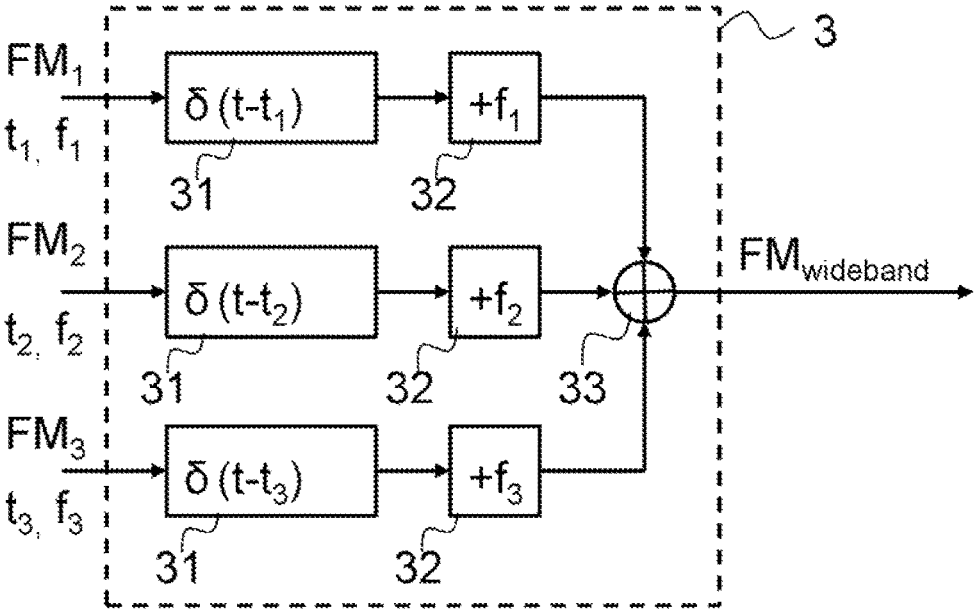
FIG. 9 shows a block diagram of a reconstruction unit in the FM domain according to an example embodiment of the invention.

As an alternative to FIG. 8, FIG. 9 shows a block diagram of a reconstruction unit 3 (e.g., for the exemplary embodiment according to FIG. 2) according to an example embodiment of the invention. In this context, FM signals according to the exemplary embodiment from FIG. 2 are connected to the input of the reconstruction unit 3. Additionally, the time delays t determined according to the alignment unit 2 and carrier frequencies f used according to the splitter unit 1 are supplied to the reconstruction unit 3 for each FM signal.

The frequency bands $FM_1$ to $FM_3$ supplied at the input of the reconstruction unit 3 are displaced via a time displacement unit 31 and a frequency adding unit 32 to the corresponding positions of the measurement signal $RF_{in}$. Following the time displacement and frequency displacement, an addition of all frequency bands is implemented by means of the adding unit 33. A broadband reconstructed measurement signal $RF_{recon}$ is generated at the output of the reconstruction unit 3.

Figure 10:
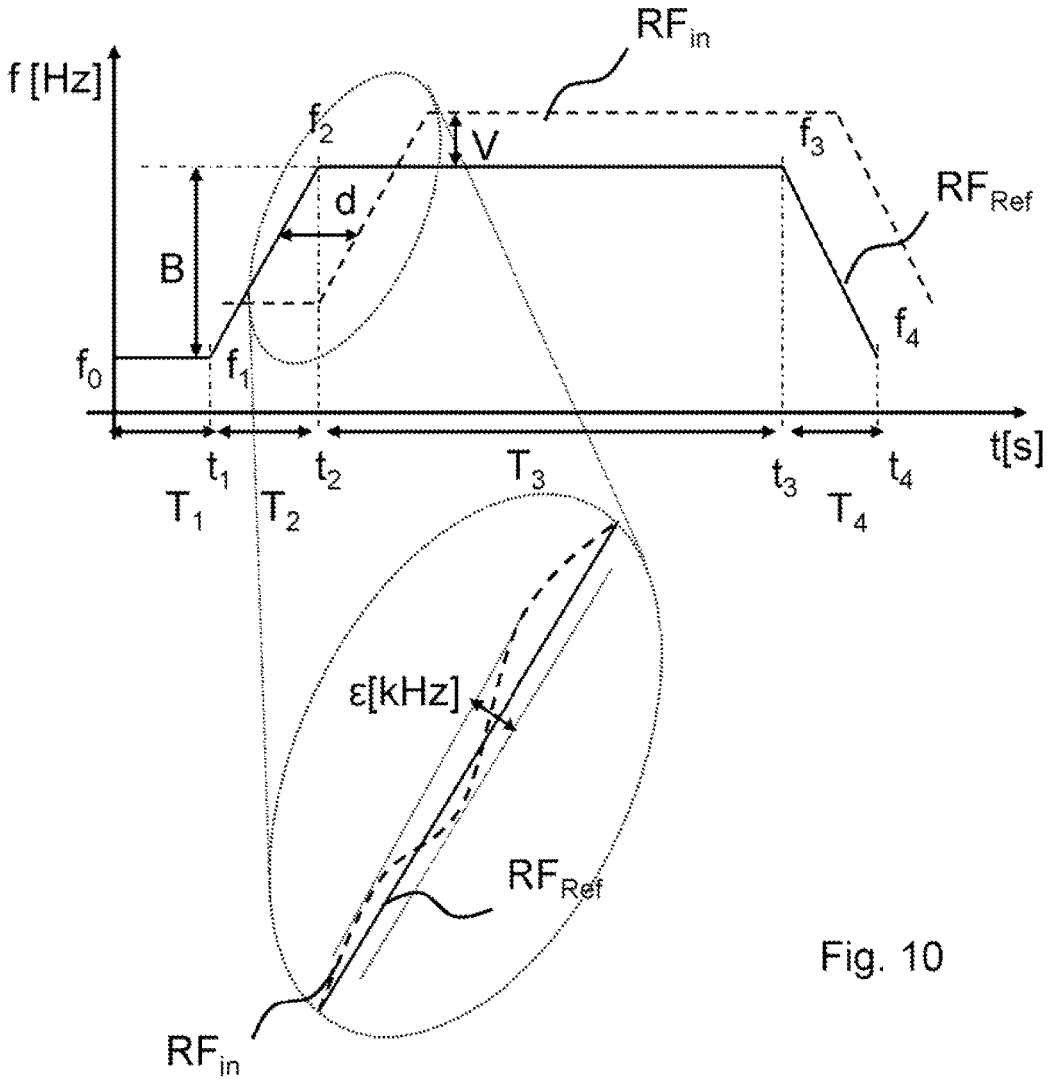
FIG. 10 shows a broadband measurement signal with reference signal according to an example embodiment of the invention.

FIG. 10 shows a period of a broadband measurement signal $RF_{in}$ used according to example embodiments of the invention, as utilized, for example, in radar systems. In this context, the change in the frequency f is shown dependent upon the time t. Such measurement signals $RF_{in}$ are also designated as partially linear-frequency-modulated signals. They are characterized by their parameterization. In this context, the number of segments in which the frequency of the measurement signal $RF_{in}$ is constant or linear-variant is a first parameter. According to FIG. 10, four segments are provided which each have a characteristic segment duration $T_1$ to $T_4$.

A second parameter is the start time to at which a period of the measurement signal $RF_{in}$ begins. A frequency offset $f_0$ is provided as a third parameter. Similarly, the maximal frequency $f_2$, or respectively, on the basis of the characteristic shown, also the frequency $f_3$, is characteristic for such a measurement signal $RF_{in}$ as a fourth parameter.

The illustrated signal can be described mathematically as follows:

$$FM(t) = \sum_{n=1}^{N}\left(\left(\frac{f_n - f_{n-1}}{T_n}\right)\cdot(t - t_n) + f_{n-1}\right)\cdot g(t - t_n; T_n) \text{für} t \in [t_0, t_N]$$

where the symbols denote:

| | |
|---|---|
| $f_n$: | end frequency of a segment n |
| $t_N$: | time offset per segment n |
| $t_0$: | time offset before segment 1 |
| $T_N$: | time duration of the n-th segment |
| N: | number of segments |
| N: | n-th segment |
| $G(T; T_N)$: | window function |

A signal $RF_{ref}$ is now transmitted from a transmitter, and a corresponding broadband measurement signal $RF_{in}$—illustrated with a dashed line in FIG. 10—is received. In this context, the received measurement signal $RF_{in}$ provides a time delay d and an offset V of the amplitude relative to the reference signal $RF_{ref}$. The time delay d in this context corresponds to the distance between an object and the transmitter. The amplitude offset V in this context corresponds to the relative velocity between the transmitter and the object.

The measurement signals $RF_{in}$ and $RF_{ref}$ shown in FIG. 10 provide a different linear gradient of the frequencies in segment $T_2$ and segment $T_4$. These different gradients allow an improved evaluation of the distance and the velocity of the detected object.

In order to determine the quality of a radar system, a reference signal $RF_{ref}$ is compared with the measurement signal $RF_{in}$ in a measuring device. The enlarged region illustrated in FIG. 10 shows that the received measurement signal $RF_{in}$ is slightly wave-like and differs by comparison with the transmitted reference signal $RF_{ref}$ by a deviation factor E. This deviation ε is the error of the radar system and must be determined. The deviation ε is generally a few kilohertz.

The frequency modulation of the measurement signal varies between the frequencies $f_1$ and $f_2$, which corresponds to a bandwidth B of the measurement signal. The bandwidth B of such a measurement signal $RF_{in}$ is typically 2 GHz. In order to detect the small deviation error E, a correspondingly well resolved measuring device and the use of the method according to the invention are required.

Figure 11A:
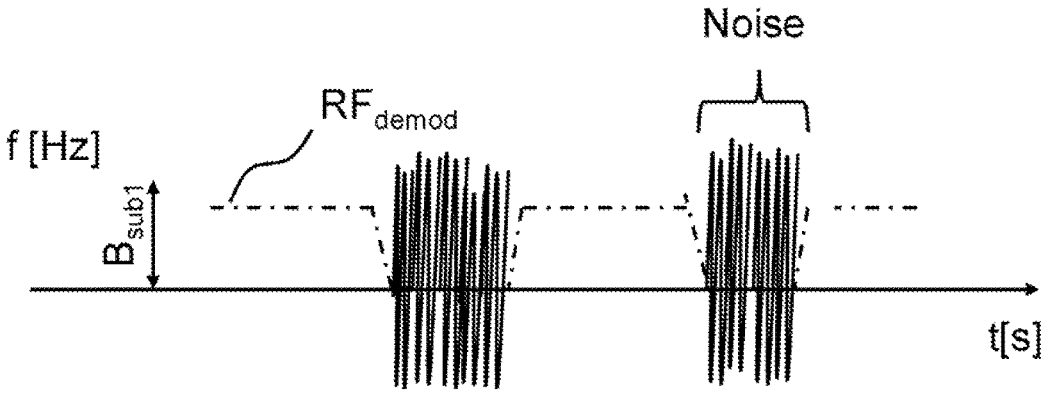
FIG. 11a shows a frequency band after the demodulation according to an example embodiment of the invention.
Figure 11B:
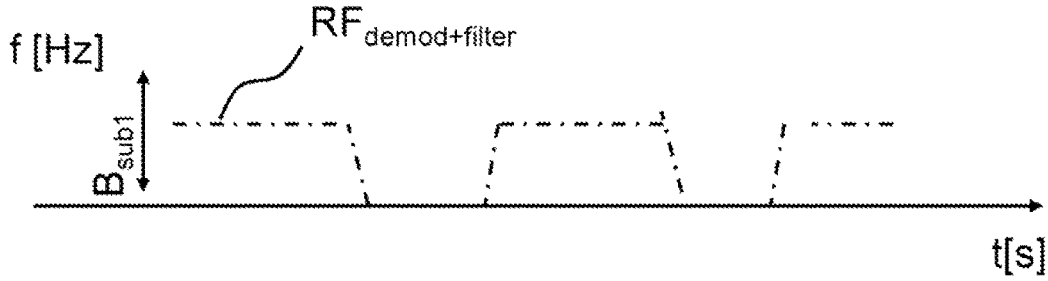
FIG. 11b shows the demodulated frequency band illustrated in FIG. 11a after a filtering.

FIG. 11a shows a frequency band (e.g., obtained according to FIG. 2) after the demodulator 5. In this context, regions which are not included by the frequency band in the context of the subdivision, are added to the signal as noise. Such noise is undesirable and is therefore filtered out before the balancing in the alignment unit 2 and the reconstruction in the reconstruction unit 3. A correspondingly filtered signal is shown according to FIG. 11b.

Figure 12A:
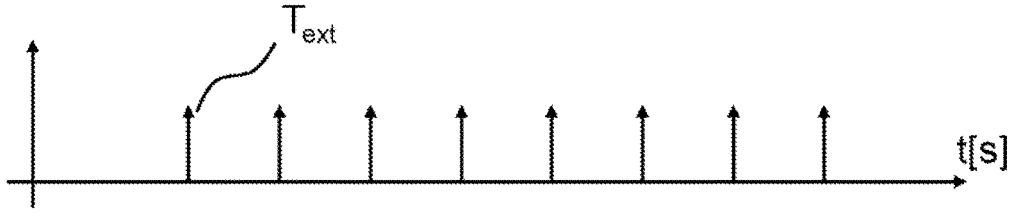
FIG. 12a shows an external trigger signal according to an example embodiment of the invention.

FIG. 12a shows an external trigger signal $T_{ext}$ according to an example embodiment of the invention. This trigger signal $T_{ext}$ comprising Dirac impulses indicates the beginning of every period of the measurement signal $RF_{in}$. In particular, this trigger signal $T_{ext}$ is useful for the reconstruction of the aligned signal in the reconstruction unit 3. Each Dirac impulse of the trigger signal $T_{ext}$ indicates the beginning of a new period of the measurement signal $RF_{in}$ in the reconstruction unit 3. Through the external trigger signal $T_{ext}$, the measurement time duration for the determination of the deviation ε can be enormously reduced, since the individual frequency bands can be positioned more simply on the basis of the trigger signal $T_{ext}$. In this case, an effort-intensive correlation is not required.

Figure 12B:
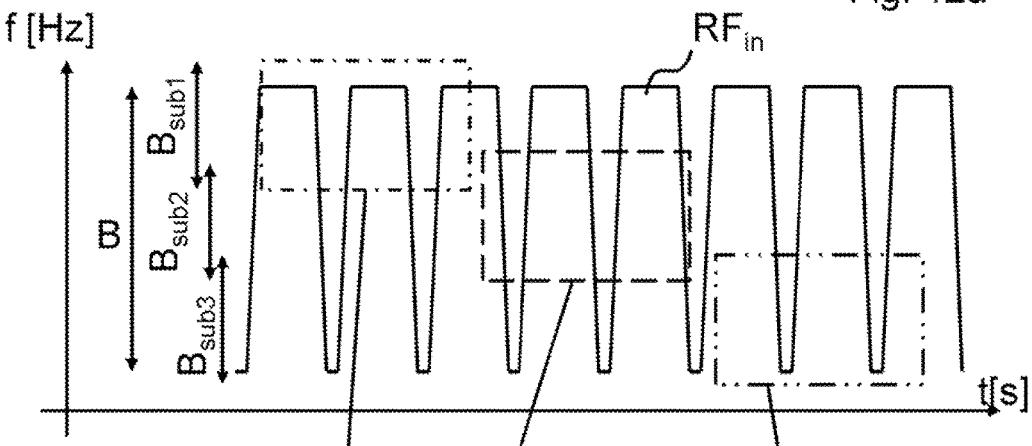
FIG. 12b shows a subdivision of the broadband measurement signal into three frequency bands according to an example embodiment of the invention.

FIG. 12b shows a measurement signal $RF_{in}$ split in three frequency bands according to an example embodiment of the invention. In this context, the bandwidth B is subdivided by means of the measuring device into three frequency bands $B_{sub1}$ to $B_{sub3}$. These frequency bands overlap and, in total, provide a relatively larger bandwidth than the bandwidth B of the measurement signal. This balances the frequency offset V between the reference signal $RF_{ref}$ and the measurement signal $RF_{in}$, and balances the offset for reconstruction the individual frequency bands.

Figure 12C:
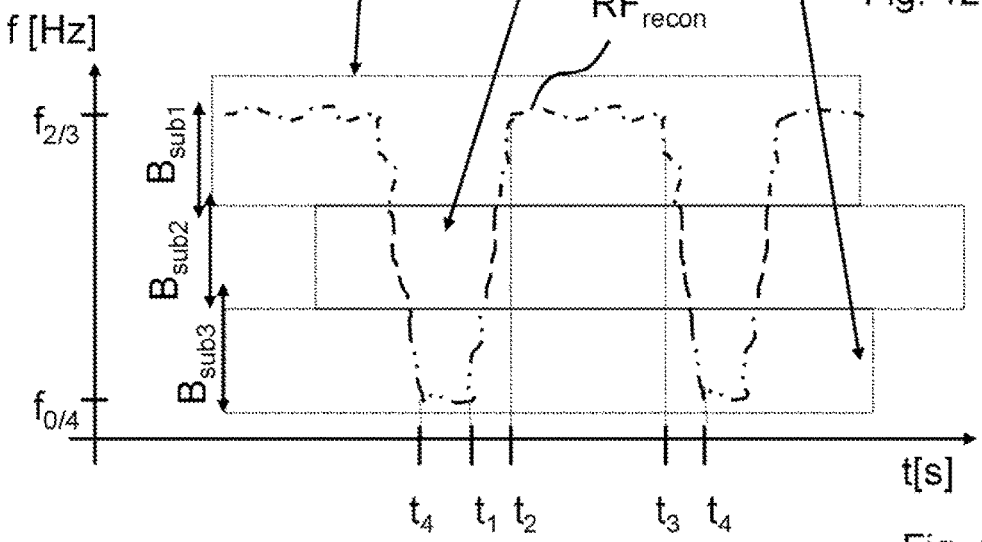
FIG. 12c shows a reconstructed broadband measurement signal according to an example embodiment of the invention.

The frequency bands obtained in this manner are combined after time-critical and frequency-critical alignment by means of the alignment unit 1 to form the reconstructed measurement signal $RF_{recon}$, as illustrated in FIG. 12c.

FIG. 12c shows a broadband reconstructed measurement signal $RF_{recon}$. In this context, it is evident that a time offset between the individual frequency bands had to be balanced. By means of the correlators 22 of the alignment unit 2, the frequency of each corresponding frequency band $RF_{sub}$ relative to the measurement signal $RF_{in}$ was determined and correctly positioned. The accordingly combined measurement signal $RF_{recon}$ provides a deviation ε which is illustrated in the form of a non-linearity of the measurement signal. This nonlinearity represents the deviation factor ε of the radar system.

The nonlinearity shown in FIG. 12c is illustrated in an exaggerated manner. Through subtraction of the reference signal $RF_{ref}$ from the combined reconstructed signal $RF_{recon}$, a deviation signal ε is obtained. The measurement signal $RF_{in}$ is periodic. Because of the digital character, all periods of the measurement signal $RF_{in}$ can be supplied sequentially to the subdivision unit 1. Video filters are used to reduce a background noise of the measuring device which would lead to an additional deterioration of the reconstructed signal $RF_{recon}$. The video filters are arranged after the frequency demodulation 5.

As an alternative, an averaging of the measurements over a plurality of periods of the measurement signal $RF_{in}$, also designated as a Trace Averaging, is implemented in order to reduce the background noise. These several periods of the measurement signal $RF_{in}$ are averaged to form one period. An average value of the period of the measurement signal $RF_{in}$ is obtained, thereby reducing major nonlinearities of the measurement signal. The average formation is implemented after the reconstruction of the signal $RF_{recon}$ and before the evaluation.

A correlation is advantageous, because a noise of the signal must be calculated out in order to find the frequency threshold value. This is obtained, for example, by correlation with the reference signal.

As an alternative to the analysis of the I/Q signals as shown in FIG. 2 or the FM signals as shown in FIG. 3, a phase-modulated signal can also be analyzed. For a phase-modulated signal, the following applies:

$$\varphi(t)=\int\omega(t)dt$$

From the partially linear regions of the measurement signal $RF_{in}$, portions with quadratic regions are formed. The alignment of frequency bands as PM signals can also be implemented by means of correlation. The offset and time delay can also be determined by means of a maximum likelihood analysis (English: maximum likelihood).

Within the subdivision into frequency sub-bands, the use of at least two periods of the measurement signal is indispensable in order to balance the time offset in the analysis and to display a full period of the measurement signal. In the case of three frequency bands and sequential processing, a measurement signal $RF_{in}$ with six periods must therefore be analyzed.

Within the scope of the invention, all of the elements described and/or illustrated and/or claimed can be combined arbitrarily with one another. For example, a combination of the two exemplary embodiments according to FIG. 2 and FIG. 3 is not excluded. Further, in the preceding specification, various embodiments have been described with reference to the accompanying drawings. It will, however, be evident that various modifications may be made thereto, and additional embodiments may be implemented, without departing from the broader scope of the invention as set forth in the claims that follow. The specification and drawings are accordingly to be regarded in an illustrative rather than restrictive sense.

The invention claimed is:

1. A method [for determining a deviation of a broadband measurement signal from a reference signal,] comprising:

subdividing, by a signal subdividing circuit, [the] *a* broadband measurement signal into [at least two] *a plurality of* subband measurement signals;

displacing, by a signal alignment circuit, the [at least two] subband measurement signals to correspond with respective frequency bands of [the] *a* reference signal[, wherein the displacement is performed with the use of an external trigger signal]; [and reconstructing,] *generating,* by a signal reconstruction circuit, [the at least two subband measurement signals to form] a reconstructed [broadband] measurement signal *based on the displaced subband measurement signals, wherein the generation of the reconstructed measurement signal is performed with the use of an external trigger signal; and*

*analyzing the reconstructed measurement signal relative to the reference signal, wherein a deviation of the reconstructed measurement signal relative to the reference signal is used as a value for performing an error determination.*

2. The method according to claim 1, wherein the broadband measurement signal is a periodic frequency-modulated signal, and wherein a period of the signal is at least partially linear-frequency-modulated.

3. The method according to claim 1, further comprising one or more of the steps of:

subtracting the reference signal from the reconstructed broadband measurement signal; and displaying the reconstructed broadband measurement signal with the reference signal.

4. The method according to claim 1, wherein the [displacement] *displacing* step comprises correlating *each of* the subband measurement signals with *a corresponding frequency band of* the reference signal.

5. The method according to claim 1, wherein the [displacement] *subdividing* step is implemented with the use of a carrier signal.

6. The method according to claim 1, wherein the [reconstruction] step *of generating a reconstructed measurement signal* comprises adding the displaced subband measurement signals.

7. The method according to claim 1, wherein the [displacement] *displacing* step is [implemented within a] *performed in the* frequency-modulation domain[of the subband measurement signals].

8. The method according to claim 7, further comprising:

demodulating the [broadband measurement signal divided into the at least two] subband measurement signals.

9. The method according to claim 1, wherein the [displacement] *displacing* step is [implemented in an I/Q baseband of the subband measurement signals] *performed in the I/Q domain.*

10. The method according to claim 9, wherein the [reconstruction] step *of generating a reconstructed measurement signal* comprises:

time displacing each of the subband measurement signals by a time offset of the measurement signal corresponding to the reference signal;

mixing each of the time-displaced subband measurement signals with a frequency-band carrier corresponding to the reference signal frequency band;

adding the mixed subband measurement signals; and demodulating the mixed subband measurement signals to form a reconstructed broadband measurement signal.

11. The method according to claim 1, further comprising:

performing a [measurement-error] *measurement error* correction of a deviation error after the [reconstruction] step *of generating a reconstructed measurement signal.*

12. A measuring device [for the analysis of a broadband measurement signal,] comprising:

a signal subdividing component configured to subdivide [the] *a* broadband measurement signal into [at least two] *a plurality of* subband measurement signals, wherein each subband measurement signal comprises an I/Q baseband signal;

a signal displacing component configured to displace each of the subband measurement signals relative to *a* corresponding [reference-signal frequency bands] *frequency band* of a reference signal[, wherein the displacement is performed with the use of an external trigger signal]; *and* a signal reconstructing component configured to [reconstruct] *generate a reconstructed broadband measurement signal based on* the displaced subband measurement signals[to form a reconstructed broadband measurement signal], *wherein the generation of the reconstructed measurement signal is performed with the use of an external trigger signal*; and

[a signal analysis component] *wherein the measuring device is* configured to analyze the reconstructed broadband measurement signal relative to the reference signal, wherein a deviation of the reconstructed broadband measurement signal relative to the reference signal is provided as a starting value for the measuring device at which a period of the measurement signal begins.

13. The measuring device according to claim 12, [further comprising:

a processor component] *wherein the measuring device is* configured to determine a number of [measurement-signal] *measurement signal* frequency bands dependent upon the bandwidth of the [received] *broadband* measurement signal, and to increase the number of [measurement-signal] *measurement signal* frequency bands with increasing bandwidth.

[14. The measuring device according to any one of claim 12, further comprising:

a selection component configured to select a measurement period length of the broadband measurement signal.]

15. The measuring device according to claim 12, further comprising:

a noise reduction component configured to filter and/or average the reconstructed broadband measurement signal in order to reduce background noise of the measuring device.

*16. A method comprising:*

*subdividing, by a signal subdividing component, a broadband measurement signal into a plurality of subband measurement signals, wherein the broadband measurement signal is a modulated broadband signal;*

*displacing, by a signal displacing component, the subband measurement signals to correspond with respective frequency bands of a reference signal;*

*generating, by a signal reconstructing component, a reconstructed measurement signal based on the displaced subband measurement signals using a trigger signal; and*

*analyzing the reconstructed measurement signal relative to the reference signal, wherein a deviation of the reconstructed measurement signal relative to the reference signal is used as a value for performing an error determination.*

*17. The method according to claim 16, wherein the reconstructed measurement signal is created by summing a measurement value computed individually for at least two subbands of the subband measurement signals to calculate an aggregated measurement value across the at least two subbands.*

*18. The method according to claim 16, wherein the subband measurement signals together comprise substantially all of the bandwidth of the broadband measurement signal.*

*19. The method according to claim 16, further comprising one or more of the steps of:*

*subtracting the reference signal from the reconstructed measurement signal by an evaluation unit; and*

*displaying the reconstructed measurement signal with the reference signal by the evaluation unit.*

*20. The method according to claim 16, further comprising:*

*comparing the subband measurement signals with the corresponding subbands of the reference signal to determine a deviation factor reflected by the measurement signal.*

*21. The method according to claim 16, further comprising the steps of:*

*using the reference signal and the reconstructed broadband measurement signal to determine quality measurements.*

*22. The method according to claim 16, wherein the displacing step comprises correlating each of the subband measurement signals with a corresponding frequency band of the reference signal by a correlator.*

*23. The method according to claim 16, wherein the subdividing step is implemented with the use of a carrier signal.*

*24. The method according to claim 16, wherein the step of generating a reconstructed measurement signal comprises adding the displaced subband measurement signals.*

*25. The method according to claim 16, wherein the displacing step is performed in the frequency-modulation domain.*

*26. The method according to claim 20, further comprising:*

*demodulating the subband measurement signals by a demodulator.*

*27. The method according to claim 16, wherein the displacing step is performed in the I/Q domain.*

*28. The method according to claim 16, wherein the step of generating a reconstructed measurement signal comprises:*

*time displacing each subband measurement signal by a time offset of the measurement signal corresponding to the reference signal;*

*mixing each time-displaced subband measurement signal with a frequency-band carrier corresponding to the reference signal frequency band;*

*adding the mixed measurement signal frequency bands; and*

*demodulating the resulting summed mixed subband measurement signal to form a reconstructed broadband measurement signal.*

*29. The method according to claim 16, further comprising:*

*performing a measurement error correction of a deviation error after the step of generating a reconstructed measurement signal.*

*30. A measuring device comprising:*

*a signal subdividing component configured to subdivide a broadband measurement signal into a plurality of subband measurement signals, wherein each subband measurement signal comprises an I/Q signal;*

*a signal displacing component configured to displace each of the subband measurement signals relative to a corresponding frequency band of a reference signal; and*

*a signal reconstructing component configured to generate a reconstructed measurement signal by combining the subband measurement signals using a trigger signal; and*

*wherein the measuring device is configured to analyze the reconstructed measurement signal relative to the reference signal, wherein a deviation of the reconstructed measurement signal relative to the reference signal is used as a value for performing an error determination.*

*31. The measuring device according to claim 30, wherein the measuring device is configured to determine a number of measurement signal frequency bands dependent upon the bandwidth of the broadband measurement signal, and to increase the number of measurement frequency bands with increasing bandwidth.*

*32. The measuring device according to claim 30, further comprising:*

*a noise reduction component configured to filter and/or average the reconstructed broadband measurement signal in order to reduce background noise of the measuring device.*

*33. The measuring device according to claim 30, wherein the correlator is configured to correlate the subband measurement signals with the reference signal.*

*34. The measuring device according to claim 30, wherein the reconstructing component is configured to reconstruct the subband measurement signals to form a reconstructed broadband measurement signal.*

*35. The measuring device according to claim 30, wherein the reconstructing component is configured to create the aggregated measurement by summing a measurement value computed for at least two subbands to calculate the measurement value across the at least two subbands.*

* * * * *